United States Patent
Morinaga et al.

(10) Patent No.: US 10,600,712 B2
(45) Date of Patent: Mar. 24, 2020

(54) ELECTRONIC DEVICE

(71) Applicant: SHINDENGEN ELECTRIC MANUFACTURING CO., LTD., Tokyo (JP)

(72) Inventors: Yuji Morinaga, Hanno (JP); Soichiro Umeda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/570,864

(22) PCT Filed: Feb. 20, 2017

(86) PCT No.: PCT/JP2017/006023
§ 371 (c)(1),
(2) Date: Oct. 31, 2017

(87) PCT Pub. No.: WO2018/150553
PCT Pub. Date: Aug. 23, 2018

(65) Prior Publication Data
US 2019/0051577 A1    Feb. 14, 2019

(51) Int. Cl.
*H01L 23/34* (2006.01)
*H01L 25/07* (2006.01)
(Continued)

(52) U.S. Cl.
CPC ............ *H01L 23/345* (2013.01); *H01L 23/48* (2013.01); *H01L 23/481* (2013.01);
(Continued)

(58) Field of Classification Search
CPC . H01L 2224/37011; H01L 2224/37013; H01L 2224/4007; H01L 2224/0603; H01L 24/36–41; H01L 2224/40091–40095
See application file for complete search history.

(56) References Cited

U.S. PATENT DOCUMENTS 5,872,403 A * 2/1999 Bowman ............. H01L 23/3121
174/549
2002/0048158 A1  4/2002 Hashimoto
(Continued)

FOREIGN PATENT DOCUMENTS

JP   2008-294390 A   12/2008
JP    2008294290 A   12/2008
(Continued)

OTHER PUBLICATIONS

International Search Report for PCT/JP2017/006023 dated Apr. 25, 2017, and its English machine translation from Bing.com Microsoft Translator.

(Continued)

*Primary Examiner* — Ismail A Muse
(74) *Attorney, Agent, or Firm* — Ladas & Parry, LLP (57) ABSTRACT

An electronic device has a substrate 5, a first electric element 91 provided on a first conductor layer 71, a second electric element 92 provided on the first electric element 91, and a connector 50 having a base end part 45 provided on a second conductor layer 72 and a head part 40 provided on a front surface electrode 92a of the second electric element 92 via a conductive adhesive 75. An area of the base end part 45 placed on the second conductor layer 72 is larger than an area of the head part 40 placed on the second electric element 92. The base end part 45 is located at a side of the substrate 5 compared with the head part 40, and a gravity center position of the connector 50 is at a side of the base end part 45 of the connector 50.

6 Claims, 11 Drawing Sheets (51) Int. Cl.
*H01L 23/482* (2006.01)
*H01L 23/48* (2006.01)
*H01L 23/00* (2006.01)
*H01L 25/18* (2006.01)

(52) U.S. Cl.
CPC .......... *H01L 23/4828* (2013.01); *H01L 24/37* (2013.01); *H01L 24/40* (2013.01); *H01L 25/074* (2013.01); *H01L 25/18* (2013.01); *H01L 24/32* (2013.01); *H01L 24/73* (2013.01); *H01L 24/84* (2013.01); *H01L 2224/291* (2013.01); *H01L 2224/32145* (2013.01); *H01L 2224/32238* (2013.01); *H01L 2224/32245* (2013.01); *H01L 2224/33181* (2013.01); *H01L 2224/37012* (2013.01); *H01L 2224/37013* (2013.01); *H01L 2224/37147* (2013.01); *H01L 2224/40* (2013.01); *H01L 2224/40105* (2013.01); *H01L 2224/40249* (2013.01); *H01L 2224/73263* (2013.01); *H01L 2224/84138* (2013.01); *H01L 2224/84801* (2013.01); *H01L 2924/13091* (2013.01)

(56) References Cited

U.S. PATENT DOCUMENTS

| | | | |
|---|---|---|---|
| 2003/0161089 A1 | 8/2003 | Togashi | |
| 2005/0224945 A1* | 10/2005 | Saito | H01L 23/49575 257/686 |
| 2010/0127277 A1* | 5/2010 | Arai | H01L 21/8213 257/77 |
| 2011/0024884 A1 | 2/2011 | Xue et al. | |
| 2011/0227205 A1* | 9/2011 | Lu | H01L 23/29524 257/670 |
| 2012/0068357 A1 | 3/2012 | Saito et al. | |
| 2012/0248592 A1* | 10/2012 | Hata | H01L 23/49513 257/676 |
| 2014/0154843 A1* | 6/2014 | Liu | H01L 23/49524 438/123 |
| 2014/0306328 A1* | 10/2014 | Mikado | H01L 23/28 257/666 |
| 2014/0347838 A1 | 11/2014 | Nagaya et al. | |
| 2015/0001692 A1* | 1/2015 | Tsai | H01L 23/49525 257/666 |
| 2015/0270199 A1* | 9/2015 | Sunaga | H01L 24/37 257/288 |
| 2015/0287666 A1* | 10/2015 | Groenhuis | H01L 24/37 257/676 |
| 2015/0289369 A1* | 10/2015 | Sunaga | H01L 23/3735 361/783 |
| 2015/0342074 A1* | 11/2015 | Sunaga | H01L 23/3735 361/728 |
| 2016/0181221 A1* | 6/2016 | Sunaga | H01L 24/37 257/139 |
| 2018/0166397 A1* | 6/2018 | Yamada | H01L 23/36 |
| 2018/0166549 A1* | 6/2018 | Kato | H01L 23/3735 |
| 2018/0174951 A1* | 6/2018 | Fan | H01L 23/49568 |
| 2019/0139866 A1* | 5/2019 | Kuraya | H01L 23/495 |
| 2019/0189544 A1* | 6/2019 | Yandoc | H01L 23/49551 |
| 2019/0318982 A1* | 10/2019 | Umeda | H01L 24/48 |

FOREIGN PATENT DOCUMENTS

| | | |
|---|---|---|
| JP | 2010-129746 A | 6/2010 |
| JP | 2012-69640 A | 4/2012 |
| JP | 2013-222905 A | 10/2013 |
| JP | 2014-229763 A | 12/2014 |
| KR | 20020019410 A | 3/2002 |
| KR | 2003071509 A | 9/2003 |
| WO | 2015/059882 A1 | 4/2015 |

OTHER PUBLICATIONS

From KR App. No. 20187003071, notice of allowance dated Nov. 28, 2018, with its English translation from Global Dossier.
From PCT/JP2017/006023, Written Opinion from the International Searching Authority, dated Aug. 23, 2018, with machine English translation from Google Translate.
From PCT/JP2017/006023, International Search Report, dated Aug. 23, 2018 with English translation from WIPO.

* cited by examiner

ELECTRONIC DEVICE

CROSS-REFERENCE TO RELATED APPLICATION

The present application is the U.S. national phase of PCT Application PCT/JP2017/006023 filed on Feb. 20, 2017, the disclosure of which is incorporated herein by reference in its entirety.

TECHNICAL FIELD

The present invention relates to an electronic device.

BACKGROUND ART

There is conventionally known an electronic device that includes an electric element stacked in two or more stages, and is sealed with a sealing part such as a sealing resin. When two or more electric elements are stacked in this manner, there has been used an aspect in which the electric element and a conductor layer are connected by a plurality of wires. However, when an upper electric element generates heat, heat dissipation has not been sufficient as compared with that of a lower electric element, since the heat is dissipated through the wire or the lower electric element.

In this regard, it has been proposed to provide an interposer between the electric elements in order to improve heat dissipation properties (e.g., see JP 2013-222905 A). However, since providing such an interposer requires one extra member, it has been expected to improve heat dissipation properties with a simple configuration without providing such a member.

SUMMARY OF INVENTION

Technical Problem

In view of the above, the present invention provides an electronic device that can efficiently dissipate heat generated from an electric element.

Solution to Problem

An electronic device according to the present invention comprises:
  a substrate;
  a conductor layer having a first conductor layer and a second conductor layer provided on the substrate,
  a first electric element provided on the first conductor layer;
  a second electric element provided on the first electric element; and
  a connector having a base end part provided on the second conductor layer and a head part integrally formed with the base end part and connected to a front surface electrode of the second electric element via a conductive adhesive,
  wherein an area of the base end part placed on the second conductor layer is larger than an area of the head part placed on the second electric element, and
  wherein the base end part is located at a side of the substrate compared with the head part, and a gravity center position of the connector is at a side of the base end part of the connector.

In the electronic device according to the present invention,
  the first electric element and the second electric element may be power semiconductor elements, and
  a heating amount of the first electric element may be larger than a heating amount of the second electric element.

The electronic device, according to the present invention, may further comprise one or more third electric elements provided above the first electric element and provided below the second electric element.

In the electronic device according to the present invention,
  the head part may have a second projection protruding toward a side of the second electric element and a first projection protruding toward the side of the second electric element from the second projection.

In the electronic device according to the present invention,
  the head part may have a second projection protruding toward a side of the second electric element,
  the base end part may have a supporting surface,
  a planar shape of the second projection may be an oval shape, and
  a planar shape of the supporting surface may be a rectangular shape.

In the electronic device according to the present invention,
  the base end part may have a supporting surface and a recess provided on a peripheral edge of the supporting surface.

In the electronic device according to the present invention,
  the base end part may have a bent part being bent and extending toward a front surface side, and
  the recess may extend toward the front surface side at least up to the bent part.

Advantageous Effects of Invention

In the present invention, the area of the base end part of the connector placed on the second conductor layer is larger than the area of the head part of the connector placed on the second semiconductor element. Further, the gravity center position of the connector is above the base end part of the connector, and therefore an inclination of the head part of the connector can be prevented. Due to these matters, heat generated from the first electric element or the second electric element can be efficiently transmitted and escaped to the second conductor layer in a stable state.

Since the gravity center position of the connector is above the base end part of the connector, an inclination of the head part of the connector can be prevented. As a result, reduction in reliability due to thinning of a solder thickness at a peripheral part of the head part can be prevented.

BRIEF DESCRIPTION OF DRAWINGS

FIG. 7(*a*) is a side cross-sectional view showing an aspect in which only one piece of third semiconductor element is provided, and FIG. 7(*b*) is a side cross-sectional view showing an aspect in which two pieces of the third semiconductor elements are provided.

DESCRIPTION OF EMBODIMENTS

Embodiment

<<Configuration>>

Figure 1:
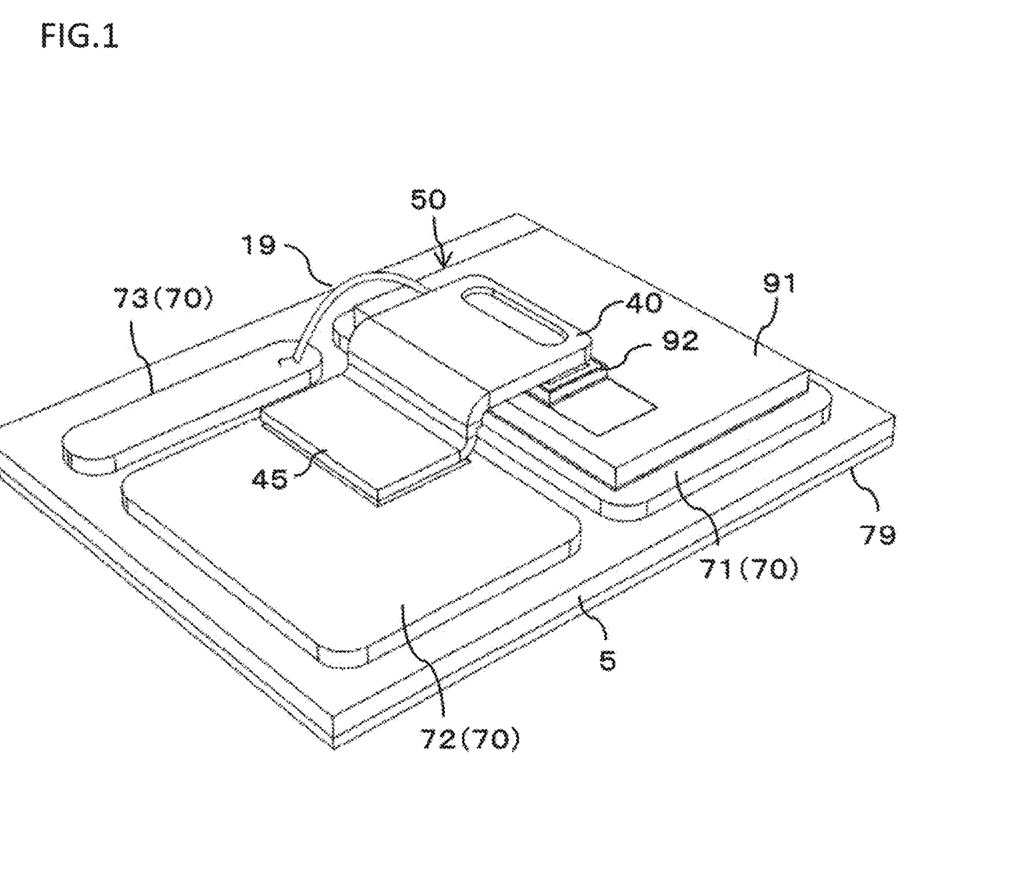
FIG. 1 is a perspective view of a semiconductor device according to an embodiment of the present invention.

As shown in FIG. 1, a semiconductor device as an example of an electronic device of this embodiment may have a substrate 5 made of an insulating material for example, and a conductor layer 70 provided on the substrate 5 and made of copper or the like. A rear surface of the substrate 5 may be provided with a heat radiating plate 79 made of copper or the like. The semiconductor device may have a sealing part 80 (see FIG. 11) made of a sealing resin or the like, and semiconductor elements 91 and 92 as an example of electric elements provided in the sealing part 80. A terminal (not shown) connected to the conductor layer 70 may protrude outside from the sealing part 80.

The conductor layer 70 may have a first conductor layer 71 and a second conductor layer 72, provided on the substrate 5. Further, the semiconductor elements 91 and 92 may have a first semiconductor element 91 provided on the first conductor layer 71, as an example of a first electric element, and a second semiconductor element 92 provided above the first semiconductor element 91, as an example of a second electric element. In this embodiment, the aspect, in which the semiconductor device is used as an electronic device, the first semiconductor element 91 is used as a first electric element and the second semiconductor element 92 is used as a second electric element, is used. However, the present invention is not limited to this, and especially a semiconductor is not required to be used.

Figure 2:
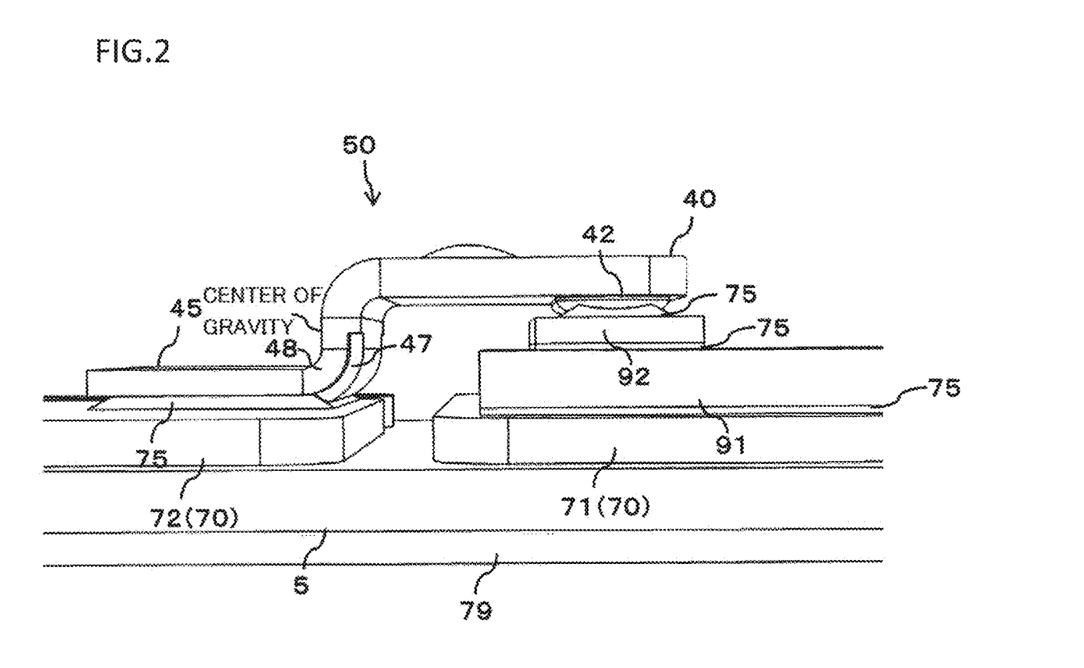
FIG. 2 is a side view enlarging a part of a semiconductor device according to the embodiment of the present invention.

As shown in FIG. 2, the semiconductor device may have a connector 50 having a base end part 45 provided on the second conductor layer 72 via a conductive adhesive 75 such as solder, and a head part 40 integrally formed with the base end part 45 and provided on a front surface of the second semiconductor element 92 via a conductive adhesive 75. Between a rear surface of the first semiconductor element 91 and the first conductor layer 71, and between a rear surface of the second semiconductor element 92 and a front surface of the first semiconductor element 91 may be connected via the conductive adhesive 75 such as solder.

An area of the base end part 45 placed on the second conductor layer 72 may be larger than the area of the head part 40 placed on the second semiconductor element 92. As an example, the area of the base end part 45 placed on the second conductor layer 72 is an area of a supporting surface 46 described later, and the area of the head part 40 placed on the second semiconductor element 92 is an area of a second projection 42 described later. The base end part 45 may be located lower than the head part 40 (at a side of the substrate 5), and a gravity center position of the connector 50 may be at a side of the base end part 45 of the connector 50 (see FIGS. 4 and 11). A hemispherical projection shown in FIG. 11 indicates a position of the center of gravity calculated as a result of simulation.

The first semiconductor element 91 may be a cascode-connected switching element, and the second semiconductor element 92 may be a control element. In this case, a heating amount of the switching element may be larger than a heating amount of the control element. As an example, the first semiconductor element 91 may be a silicon carbide power device or a gallium nitride power device, and the second semiconductor element 92 may be a MOSFET. Further, the second semiconductor element 92 may be an integrated circuit, a switching element, or a rectifier element. As shown in FIG. 1, the conductor layer 70 may have a third conductor layer 73. As an example, the third conductor layer 73 is used when the second semiconductor element 92 is a switching element. In addition, each of the first semiconductor element 91 and the second semiconductor element 92 may be a power semiconductor element.

Using the connector 50 as in this embodiment allows a wiring resistance to be reduced. While the wire is generally made of aluminum, the connector 50 can be formed of a material including copper (including only copper). Adopting the material including copper in this way allows further reduction of the wiring resistance, enabling reduction of noise emitted from the switching element. In particular, when the first semiconductor element 91 is a cascode-connected switching element (a silicon carbide power device or a gallium nitride power device), since a switching speed of the switch is high, influence of noise tends to be increased. In this regard, adopting the connector 50 made of the material including copper enables reduction of influence of noise as described above. In addition, current flows even if the switching speed of the switching element is decreased since the wiring resistance can be reduced. Also in this result, generation of noise can be reduced.

Figure 7:
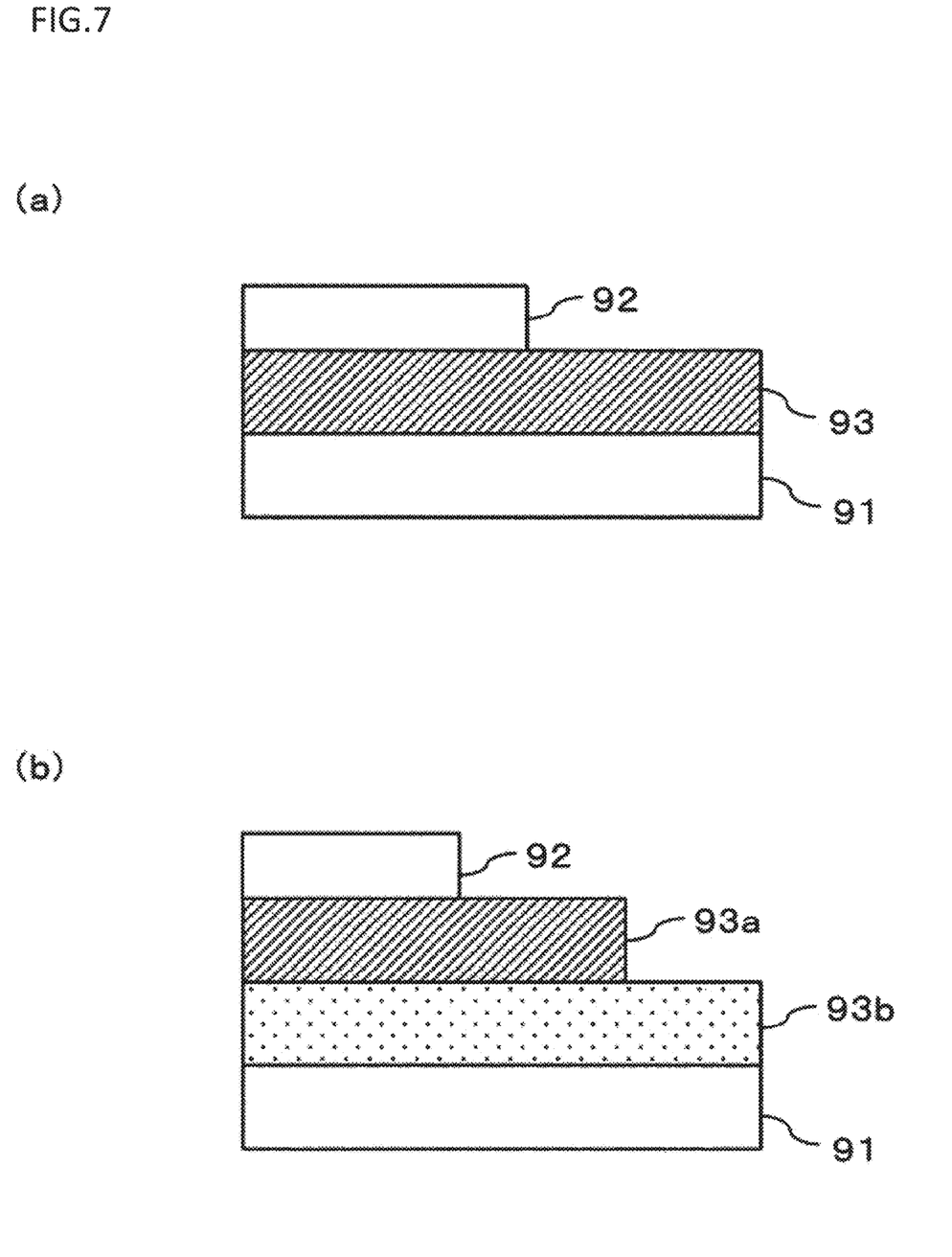

Further, as shown in FIGS. 7(*a*) and 7(*b*), the semiconductor elements (electric elements) may be stacked in three or more, and there may be provided one or more third semiconductor elements (third electric elements) 93 provided above the first semiconductor element 91 and provided below the second semiconductor element 92. When three or more semiconductor elements are provided in this manner, heat is more apt to be retained. Therefore, adopting the connector 50 of this embodiment becomes technically significant. FIG. 7(*a*) shows an aspect in which only one piece of the third semiconductor element 93 is provided, and FIG. 7(*b*) shows an aspect in which two pieces of the third semiconductor elements 93*a* and 93*b* are provided. The number of the third semiconductor element is not limited to this, but may be three or more.

Figure 3:
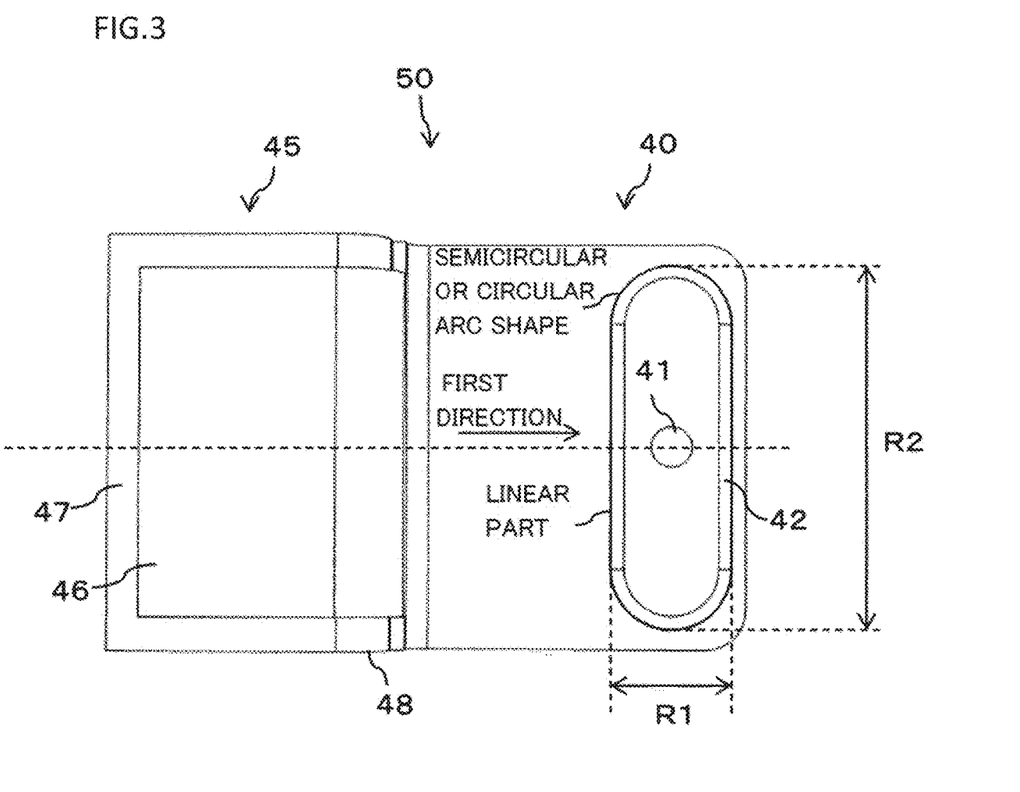
FIG. 3 is a bottom view showing a connector used in the embodiment of the present invention.

As shown in FIG. 3, the head part 40 may have a first projection 41 protruding toward the second semiconductor element 92 side. The first projection 41 may sink into the conductive adhesive 75 and contact with the front surface of the second semiconductor element 92 at a point. The base end part 45 may have the supporting surface 46 that is in contact with the conductor layer 70 or is provided on the conductive adhesive 75 on the conductor layer 70.

Figure 8:
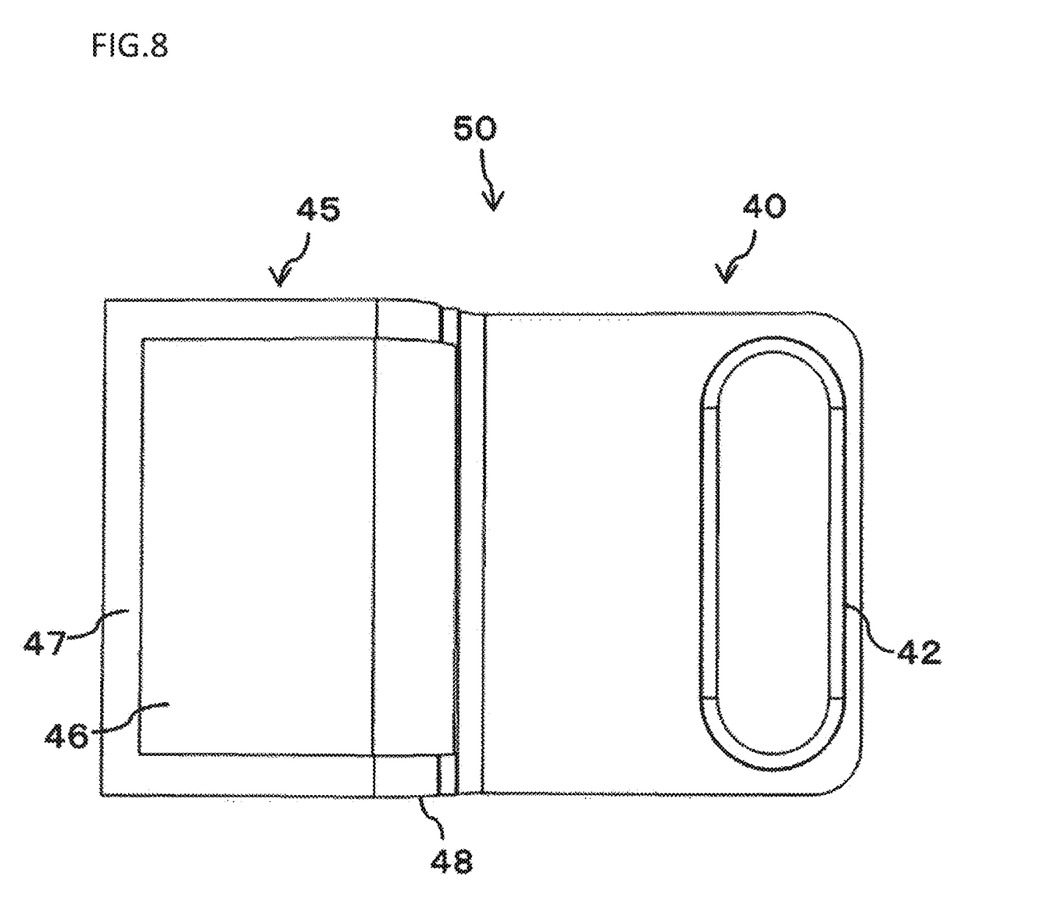
FIG. 8 is a bottom view showing one modification of a connector used in the embodiment of the present invention.
Figure 9:
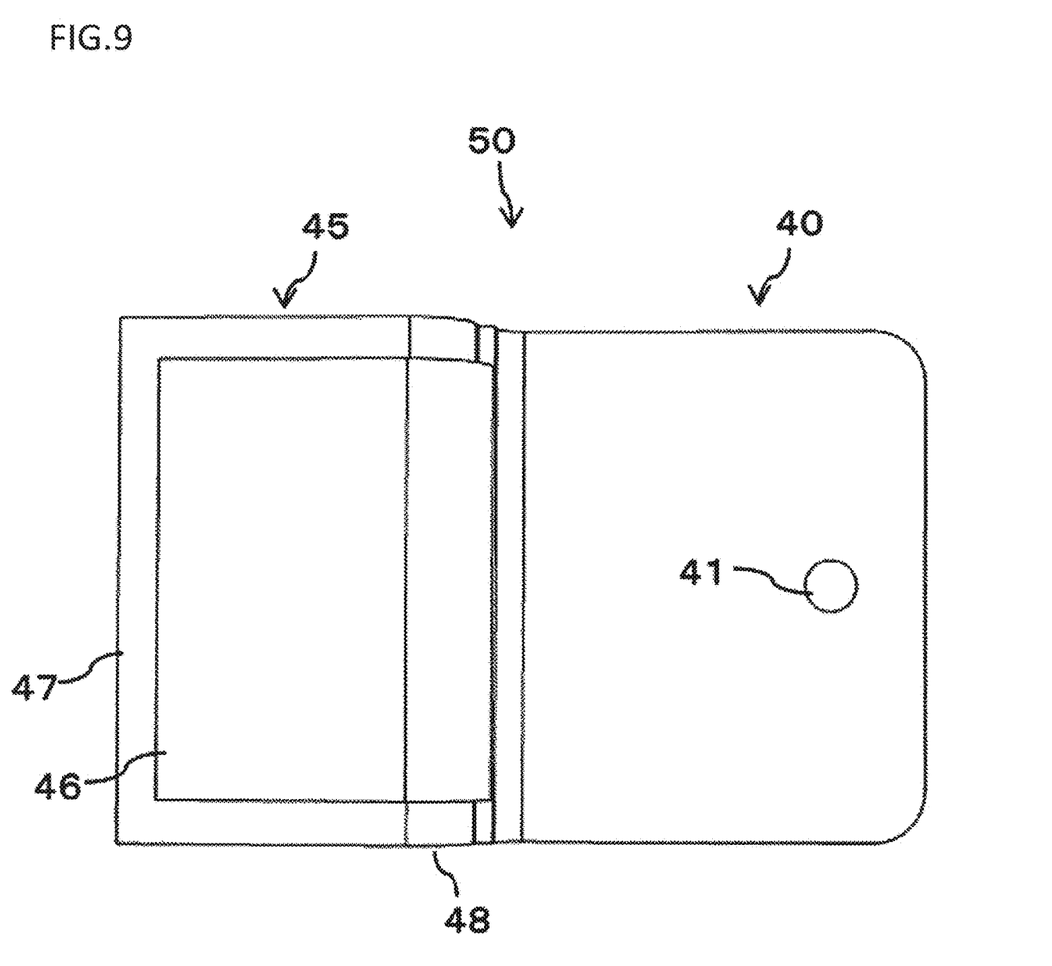
FIG. 9 is a bottom view showing another modification of a connector used in the embodiment of the present invention.

As shown in FIG. 3, the head part 40 may have the second projection 42 protruding toward the second semiconductor element 92 side, in addition to the first projection 41, or may have only the second projection 42 without having the first projection 41, as shown in FIG. 8. Further, as shown in FIG. 9, the head part 40 may have only the first projection 41 without having the second projection 42. When the head part 40 has the first projection 41 and the second projection 42, the first projection 41 protrudes from the second projection 42 toward the second semiconductor element 92 side.

As shown in FIG. 3, the base end part 45 may have a recess 47 provided on a periphery of the supporting surface 46. The recess 47 may be provided to surround the entire supporting surface 46, or may be formed to continuously surround three sides of the supporting surface 46 on the base end side, as shown in FIG. 3. Additionally, the recess 47 may be formed to intermittently, not continuously, surround the supporting surface 46. Further, the base end part 45 may have a bent part 48 being bent and extending toward the front surface side (an upper side in FIG. 4). The recess 47 may extend to the front surface side along the bent part 48 extending from the supporting surface 46 to the front surface side. When adopting an aspect in which the recess 47 extends toward the front surface side along the bent part 48 as described above, it is advantageous in that the conductive adhesive 75 can be provided along the recess 47 provided to the bent part 48, and a ferret can be easily formed.

Figure 4:
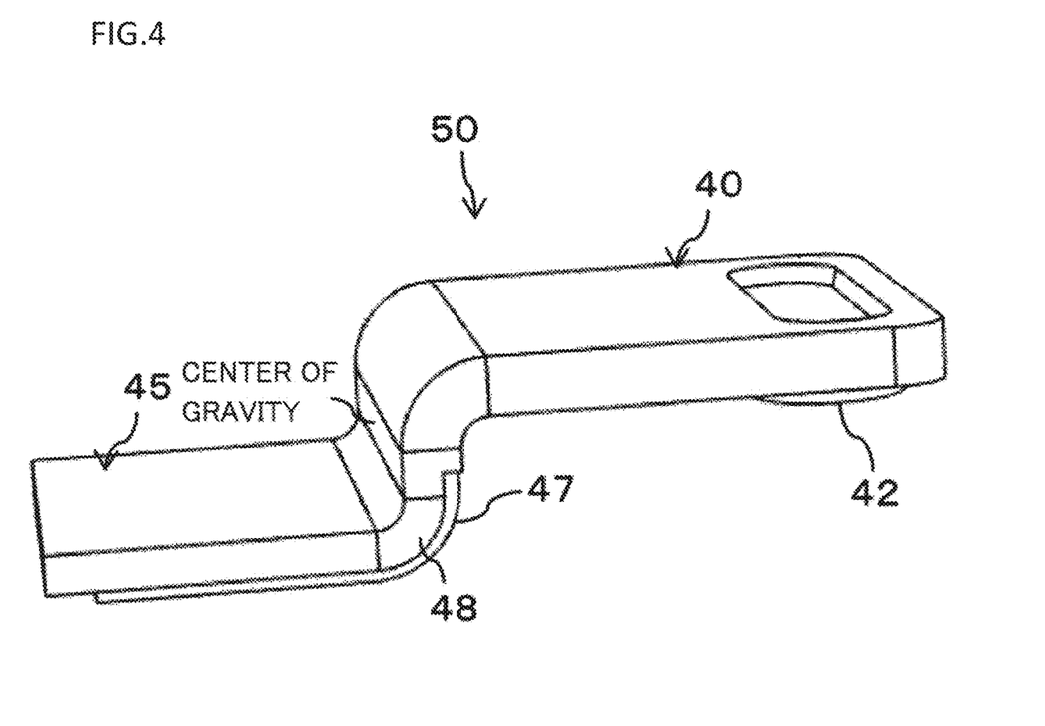
FIG. 4 is a perspective view showing a connector used in the embodiment of the present invention.

In addition, when a tip end (upper end) of the recess 47 is provided to the bent part 48, a shape of the recess 47 may be collapsed when the bent part 48 is formed. In this regard, as shown in FIG. 4, positioning an end part of the recess 47 at a position higher than the bent part 48 can prevent in advance the shape of the recess 47 from being collapsed when the bent part 48 is formed.

When a straight line connecting a center in a width direction (vertical direction in FIG. 3) of the base end part 45 and a center in a width direction of the head part 40 is a first direction (horizontal direction in FIG. 3), a length of the supporting surface 46 along the first direction may be longer than a length of the second projection 42 along the first direction (see FIG. 3). As an example, the length of the supporting surface 46 along the first direction may be twice to three times as long as the length of the second projection 42 along the first direction.

The first projection 41 may be positioned at a center in the width direction of the head part 40.

Figure 10:
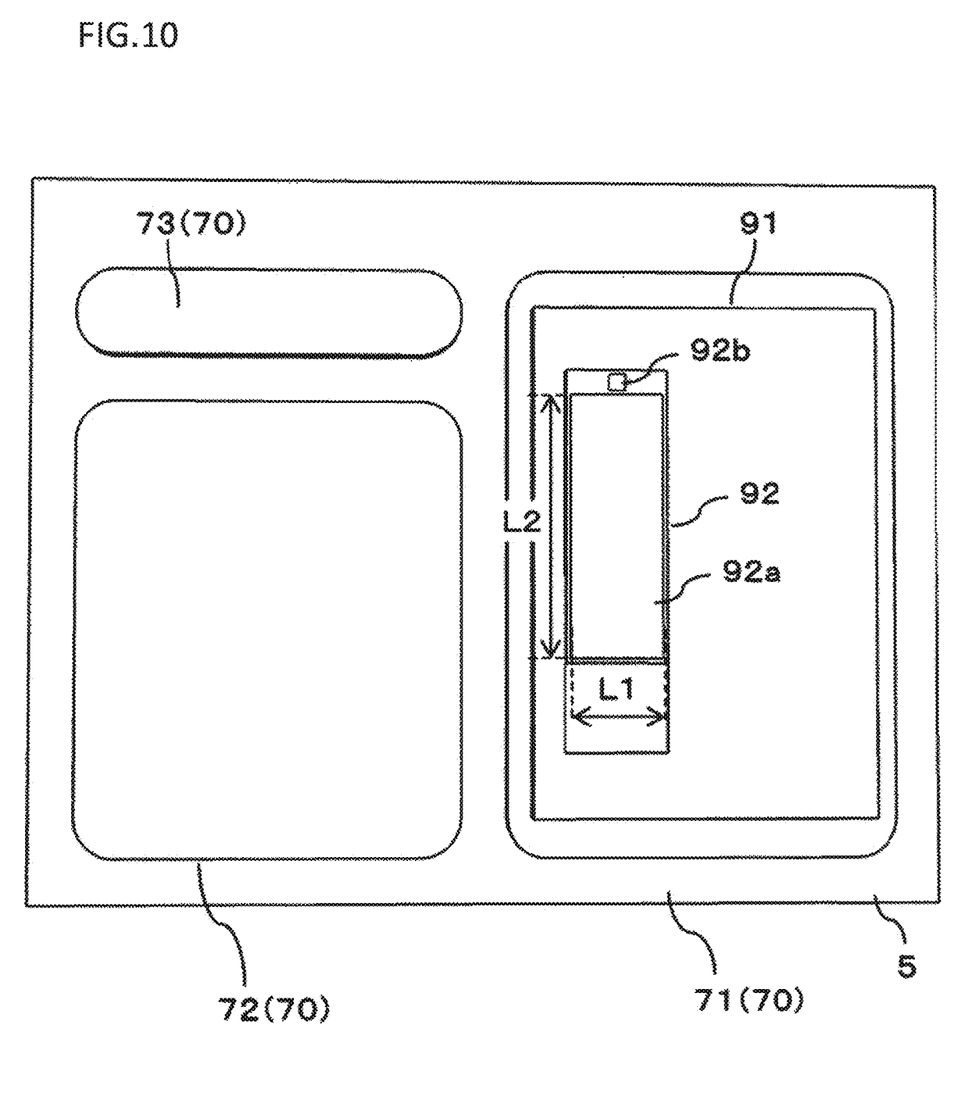
FIG. 10 is a plan view for describing a shape of a front surface electrode of a second semiconductor element used in the embodiment of the present invention.

Among the front surface electrodes of the second semiconductor element 92, a first front surface electrode 92a connected to the head part 40 may be a vertically long shape in a planar shape. As an example, the planar shape may be a rectangular shape, or may be a notched rectangular shape in which only a part provided with a second front surface electrode 92b is recessed, as shown in FIG. 10. The second front surface electrode 92b is used, for example, when the second semiconductor element 92 is a switching element. A control terminal (not shown) extending from the sealing part 80 to outside may be connected to the third conductor layer 73, and the third conductor layer 73 may be connected with the second front surface electrode 92b via a wire 19 (see FIG. 1). This control terminal may be used to control the second semiconductor element 92.

As shown in FIG. 3, a planar shape of the second projection 42 may be an oval shape. Further, a planar shape of the supporting surface 46 may be a rectangular shape. Although it can be considered to form the planar shape of the second projection 42 into a rectangular or notched rectangular shape in accordance with the planar shape of the front surface electrode 92a of the second semiconductor element 92, adapting a shape having a corner may cause a crack in the conductive adhesive 75 (see FIG. 2) provided between the second projection 42 and the second semiconductor element 92. In this regard, forming the planar shape of the second projection 42 into oval can prevent cracks in the conductive adhesive 75 provided between the second projection 42 and the second semiconductor element 92, in advance.

As in a case where the connector 50 is made of the material including copper (including only copper) and the conductor layer 70 is also made of the material including copper (including only copper), when the connector 50 and the conductor layer 70 are made of a same material or substantially same material, a difference between thermal expansion of the connector 50 and thermal expansion of the conductor layer 70 becomes small. Therefore, even when the planar shape of the supporting surface 46 is rectangular such as a square or a rectangle, cracks are not easily generated in the conductive adhesive 75 (see FIG. 2) provided between the base end part 45 of the connector 50 and the second conductor layer 72. Additionally, while the first semiconductor element 91 and the second semiconductor element 92 generate heat on the head part 40 side of the connector 50, there is no such heat generation on the base end part 45 side of the connector 50. In that sense as well, cracks are not easily generated in the conductive adhesive 75 provided between the base end part 45 of the connector 50 and the second conductor layer 72. On the other hand, forming the planar shape of the supporting surface 46 into rectangular allows a size of the supporting surface 46 to be made as large as possible, allowing the center of gravity to be more reliably positioned on the base end part 45 side. From this point, it is advantageous to adopt the aspect in which the planar shape of the second projection 42 is oval, whereas the planar shape of the supporting surface 46 is rectangular.

The planar shape of the front surface electrode 92a of the second semiconductor element 92 may correspond to the planar shape of the first projection 41. For example, when the planar shape of the front surface electrode 92a is rectangular, and the planar shape of the second projection 42 is oval, a short side L1 of the rectangle (see FIG. 10) of the front surface electrode 92a corresponds to a minor axis R1 of the oval shape (see FIG. 3) of the second projection 42, and/or a long side L2 of the rectangle of the front surface electrode 92a may correspond to a major axis R2 of the oval shape (see FIG. 3) of the second projection 42. Here, "corresponding" means being in the range of ±5% of a total length, and $L1=(1\pm0.1)\times R1$, and $L2=(1\pm0.1)\times R2$. As shown in FIG. 10, when the second front surface electrode 92b has a notched rectangular shape, a short side L1 of the notched rectangular shape of the front surface electrode 92a corresponds to the minor axis R1 of the oval shape of the second projection 42, and a long side L2 of the notched rectangular shape of the front surface electrode 92a may not correspond to a major axis R2 of the oval shape of the second projection 42, or a long side corresponding to a part not provided with a notch of the notched rectangular shape of the front surface electrode 92a may correspond to the major axis R2 of the oval shape of the second projection 42. In addition, the "oval shape" in this embodiment includes a shape having a linear part with a semicircular or circular arc shape as shown in FIG. 3.

<<Function and Effect>>

Next, among the functions and effects according to this embodiment having the above-described configuration, those that have not been described will be mainly described.

Figure 11:
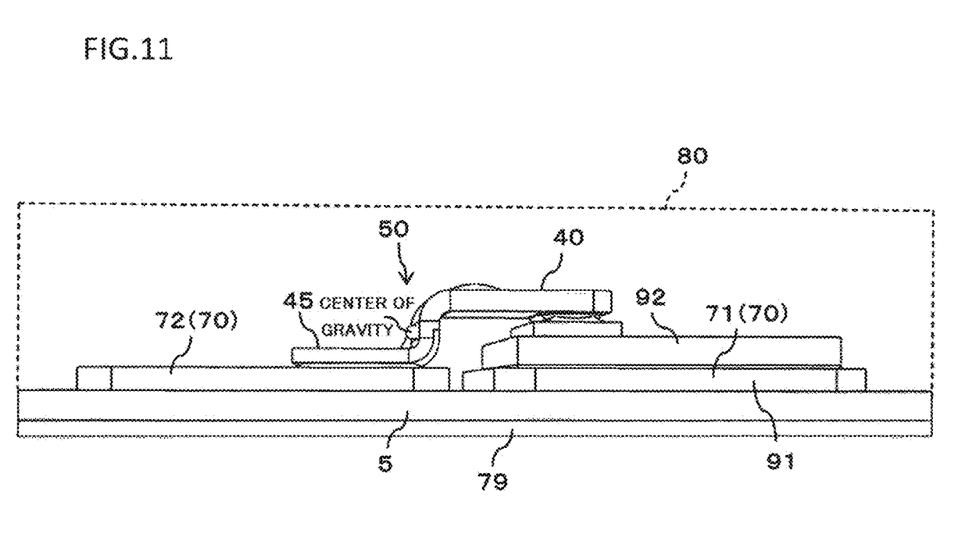
FIG. 11 is a side view of a semiconductor device according to the embodiment of the present invention.

In this embodiment, when adopting such an aspect as the area of the base end part 45 of the connector 50 placed on the second conductor layer 72 is larger than the area of the head part 40 of the connector 50 placed on the second semiconductor element 92 (see FIG. 3) and the gravity center position of the connector 50 is above the base end part 45 of the connector 50 as shown in FIGS. 4 and 11, an inclination of the head part 40 of the connector 50 can be prevented. Thus, heat generated from the first semiconductor element 91 and/or the second semiconductor element 92 can be efficiently transmitted and escaped to the second conductor layer 72 in a stable state.

Additionally, as shown in FIGS. 4 and 11, when adopting such an aspect as the gravity center position of the connector 50 is above the base end part 45 of the connector 50, it is possible to prevent inclination of the head part 40 of the connector 50, which can prevent reduction in reliability due to thinning of a solder thickness at a peripheral part of the head part 40.

As in this embodiment, in an aspect in which two or more semiconductor elements are stacked, and the head part 40 is placed on the uppermost semiconductor element (second semiconductor element 92), since the center of gravity moves upward as compared with the aspect in which the head part and the base end part are located at a same or substantially same height, the connector 50 becomes unstable. In this regard, as in this embodiment, by adopting an aspect in which the area of the base end part 45 placed on the second conductor layer 72 is increased, and the gravity center position of the connector 50 is above the base end part 45 of the connector 50, it is possible to prevent the connector 50 from becoming unstable as much as possible.

In addition, adopting the first projection 41 allows the conductive adhesive 75 to be positioned at a part not provided with the first projection 41, enabling prevention of reduction in reliability. In particular, in an aspect in which the head part 40 sinks into the conductive adhesive 75 due to the weight of the connector 50, and the first projection 41 and the front surface of the second semiconductor element 92 are in contact with each other, setting the thickness (height) of the first projection 41 to an appropriate value allows providing of the conductive adhesive 75 having an appropriate thickness between the head part 40 and the front surface of the second semiconductor element 92.

Further, as shown in FIG. 3, when adopting the aspect in which the head part 40 has the second projection 42 protruding toward the second semiconductor element 92 side, and the first projection 41 protrudes from the second projection 42 toward the second semiconductor element 92 side, it is possible to increase the thickness of the conductive adhesive 75 such as solder to a certain extent at apart not provided with the first projection 41, and to further increase the thickness of the conductive adhesive 75 at a part not provided with the first projection 41 and the second projection 42. In particular, in the aspect in which the head part 40 sinks into the conductive adhesive 75 due to the weight of the connector 50, and the first projection 41 and the front surface of the second semiconductor element 92 are in contact with each other, setting the thickness (height) of the first projection 41 and the second projection 42 to an appropriate value allows providing of the conductive adhesive 75 having an appropriate thickness between the head part 40 and the front surfaces of the semiconductor elements 91 and 92. Further, setting a width of the second projection 42 to an appropriate value allows a width of a current path to be secured.

The base end part 45 can contact with the conductor layer 70 with the supporting surface 46, or float in balance on the conductive adhesive 75 (before curing). When the supporting surface 46 contacts with the conductor layer 70, it is possible to more reliably prevent the balance of the connector 50 from being lost. On the other hand, when the supporting surface 46 is floating on the conductive adhesive 75, since the base end part 45 and the conductor layer 70 can be bonded more reliably, and the thickness of the conductive adhesive 75 can be secured when the conductive adhesive 75 cures, cracks in the conductive adhesive 75 can be prevented.

In an aspect in which the base end part 45 is connected to the conductor layer 70 via the conductive adhesive 75 such as solder, when adopting the aspect in which the base end part 45 has the supporting surface 46 and the recess 47 provided on a peripheral edge of the supporting surface 46 as shown in FIG. 3, the conductive adhesive 75 can be inserted into the recess 47, and a fillet (e.g., a solder ferret) can be easily formed by the conductive adhesive 75. Therefore, cracks can be prevented after an amount of the conductive adhesive 75 becomes insufficient and the conductive adhesive 75 is cured. In particular, when the connector 50 is heavy to an extent where the supporting surface 46 contacts with the conductor layer 70, providing such the recess 47 is advantageous in that the base end part 45 and the conductor layer 70 can be bonded by the conductive adhesive 75. In such a case, as shown in FIG. 4, it is also advantageous to adopt an aspect in which the recess 47 extends toward the front surface side along the bent part 48. This is because a fillet can be formed by the thicker conductive adhesive 75 by adopting this aspect.

There is a restriction on an amount of the conductive adhesive 75 that can be applied to the front surface of the second semiconductor element 92, and a size of the head part 40 that can be placed on the front surface of the second semiconductor element 92. In this regard, by providing the second projection 42 having a size (in an in-plane direction) of an only necessary contact area with the conductive adhesive 75, an appropriate contact area with the conductive adhesive 75 can be secured, and the amount of the conductive adhesive 75 can be made appropriate.

Further, as shown in FIG. 3, when the planar shape of the front surface electrode 92a of the second semiconductor element 92 is a vertically long shape, and the planar shape of the second projection 42 is an oval shape, and when a long side of the oval shape of the second projection 42 is provided along a longitudinal direction of the front surface electrode 92a, it is advantageous in that a width of a current path passing through the front surface electrode 92a and the second projection 42 can be widened. In addition, forming the planar shape of the second projection 42 into oval can reduce possibility of inclination of the head part 40. In particular, in an aspect in which the major axis of the oval shape is provided along a width direction (vertical direction in FIG. 3) of the head part 40, it is advantageous in that possibility of inclination of the head part 40 in the width direction can be reduced.

Adopting an aspect in which the first projection 41 is positioned at a center in the width direction (vertical direction in FIG. 3) of the head part 40 can also prevent inclination of the head part 40 in the width direction. In particular, in the aspect in which the head part 40 sinks into the conductive adhesive 75 due to the weight of the connector 50, and the first projection 41 and the front surface of the second semiconductor element 92 are in contact with each other, the head part 40 may incline in the width direction with the first projection 41 as a center. In this regard, adopting the present aspect can reduce possibility of inclination of the head part 40 in the width direction.

Figure 5:
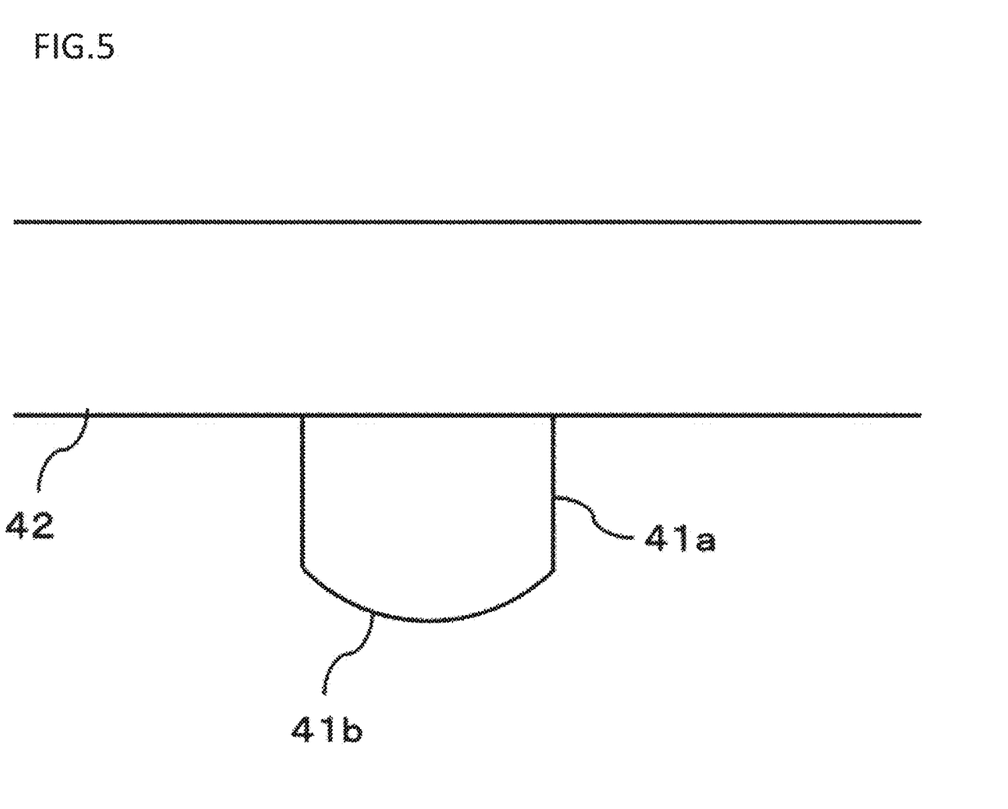
FIG. 5 is a side view showing one aspect of a first projection used in a first embodiment of the present invention.
Figure 6:
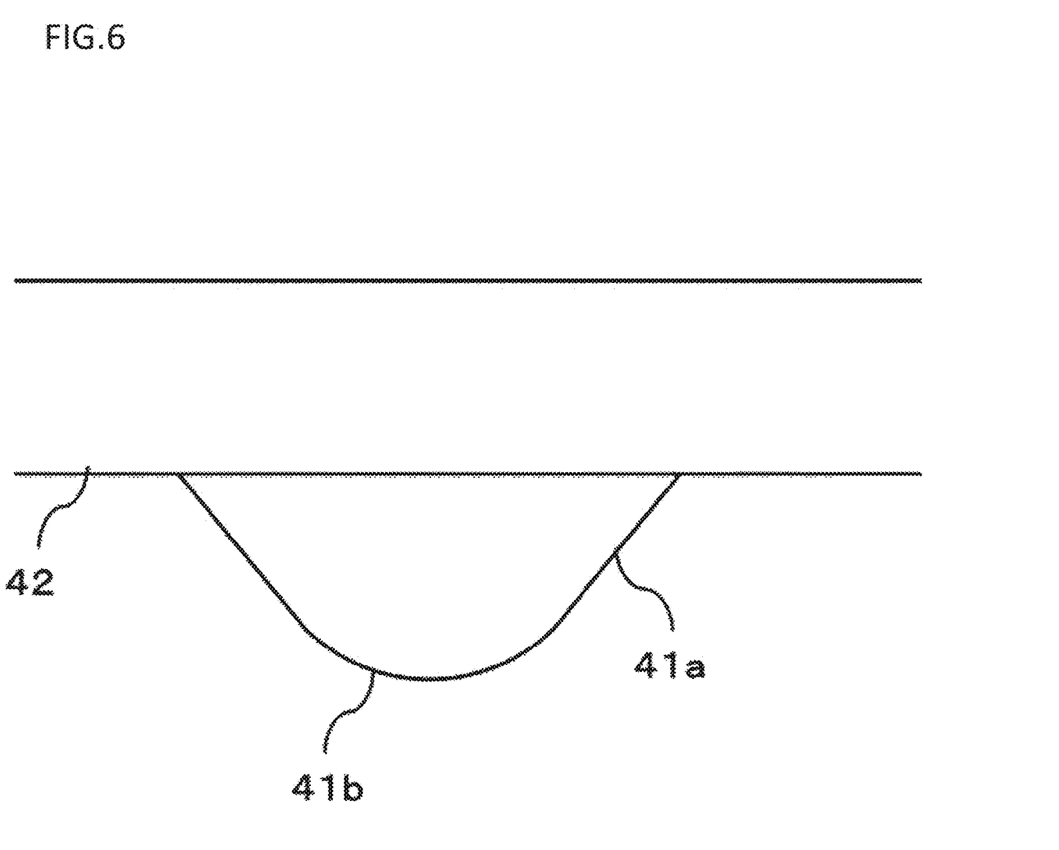
FIG. 6 is a side view showing another aspect of the first projection used in the first embodiment of the present invention.

As shown in FIGS. 5 and 6, when adopting an aspect in which the first projection 41 has a linear part 41a located on a base side of the first projection 41 and having a linear vertical sectional shape, and a hemispherical part 41b positioned on a tip end side of the linear part 41a and having a hemispherical or arcuate vertical sectional shape, a diameter of the hemispherical part 41b can be reduced. Therefore, even when the head part 40 sinks into the conductive adhesive 75, and the first projection 41 comes into contact with the front surface of the second semiconductor element 92, the first projection 41 and the front surface of the second semiconductor element 92 can be contacted with each other with a smaller area (point). This can increase the amount of the conductive adhesive 75 located between the head part 40 and the front surface of the second semiconductor element 92, enabling prevention in advance of occurrence of problems such as cracking in the conductive adhesive 75 upon curing.

As shown in FIG. 6, when adopting an aspect having a tapered shape in which a width decreases toward a tip end as the linear part 41a, it is possible to increase the conductive adhesive 75 on the tip end side. Therefore, it is possible to prevent in advance of occurrence of problems such as cracking in the conductive adhesive 75 upon curing, on the tip side close to the second semiconductor element 92. Further, since the amount of the conductive adhesive 75 can be gradually increased toward the tip end side, the conductive adhesive 75 can be evenly and reliably positioned around the first projection 41. Therefore, even in the aspect in which the head part 40 sinks into the conductive adhesive 75 due to the weight of the connector 50, and the first projection 41 and the front surfaces of the semiconductor elements 91 and 92 are in contact with each other, possibility of inclination of the head part 40 can be reduced. As shown in FIG. 5, the linear part 41a may have a cylindrical shape.

Lastly, the description of the embodiment and the disclosure of the drawings described above are merely examples for explaining the invention described in the claims, and the invention described in the claims is not limited by the description of the embodiment or the disclosure of the drawings described above. In addition, the description of the claims at the original application is merely an example, and the description of the claims can be appropriately changed based on the description of the specification, the drawings, and the like.

REFERENCE SIGNS LIST

5 Substrate
40 Head part
41 First projection
42 Second projection
45 Base end part
46 Supporting surface
47 Recess
48 Bent part
50 Connector
70 Conductor layer
71 First conductor layer
72 Second conductor layer
75 Conductive adhesive
91 First semiconductor element (First electric element)
92 Second semiconductor element (Second electric element)
92a First front surface electrode (Front surface electrode)
92b Second front surface electrode (Front surface electrode)
93 Third semiconductor element (Third electric element)

What is claimed is:

1. An electronic device comprising:
   a substrate;
   a conductor layer having a first conductor layer and a second conductor layer provided on the substrate;
   a first electric element provided on the first conductor layer;
   a second electric element provided on the first electric element; and
   a connector consisting of a base end part having a supporting surface, which is provided on the second conductor layer, and a head part integrally formed with the base end part, connected to a front surface electrode of the second electric element via a conductive adhesive, and extending parallel to the supporting surface,
   wherein an area of the base end part placed on the second conductor layer is larger than an area of the head part placed on the second electric element,
   wherein the base end part has a bent part being bent and extending toward an upper side,
   wherein the base end part is located at a side of the substrate compared with the head part, and a gravity center position of the connector is at a side of the base end part of the connector and is located lower than the head part,
   wherein the head part has a second projection protruding toward a side of the second electric element and a first projection protruding toward the side of the second electric element from the second projection,
   wherein a planar shape of the second projection is an oval shape, and
   wherein a major axis of the oval shape is provided along a width direction of the head part.

2. The electronic device according to claim 1
   wherein the first electric element and the second electric element are power semiconductor elements, and
   wherein a heating amount of the first electric element is larger than a heating amount of the second electric element.

3. The electronic device, according to claim 1, further comprising one or more third electric elements provided above the first electric element and provided below the second electric element.

4. The electronic device according to claim 1,
   wherein a planar shape of the supporting surface is a rectangular shape.

5. The electronic device according to claim 1,
   wherein the base end part has a recess provided on a peripheral edge of the supporting surface.

6. The electronic device according to claim 5,
   wherein the recess extends toward the front surface side at least up to the bent part.

* * * * *